(12) United States Patent
Arndt

(10) Patent No.: US 11,404,619 B2
(45) Date of Patent: Aug. 2, 2022

(54) LIGHT-EMITTING DIODE MODULE AND ASSEMBLY WITH A LIGHT-EMITTING DIODE MODULE

(71) Applicant: OSRAM Opto Semiconductors GmbH, Regensburg (DE)

(72) Inventor: Karlheinz Arndt, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/428,036

(22) PCT Filed: Feb. 5, 2020

(86) PCT No.: PCT/EP2020/052854
§ 371 (c)(1),
(2) Date: Aug. 3, 2021

(87) PCT Pub. No.: WO2020/161182
PCT Pub. Date: Aug. 13, 2020

(65) Prior Publication Data
US 2022/0109093 A1 Apr. 7, 2022

(30) Foreign Application Priority Data
Feb. 6, 2019 (DE) .......................... 102019102953.8

(51) Int. Cl.
*H01L 33/64* (2010.01)
*H01L 25/075* (2006.01)

(52) U.S. Cl.
CPC ........ *H01L 33/647* (2013.01); *H01L 25/0753* (2013.01)

(58) Field of Classification Search
CPC .................................................... H01L 33/647
See application file for complete search history.

(56) References Cited

U.S. PATENT DOCUMENTS

2016/0293811 A1  10/2016  Hussell et al.
2018/0132329 A1  5/2018  Yan et al.
(Continued)

FOREIGN PATENT DOCUMENTS

JP  2004311456 A  11/2004
WO  2013186035 A1  12/2013

OTHER PUBLICATIONS

International Search Report for International Patent Application No. PCT/EP2020/052854, dated Apr. 28, 2020 (6 pages).

*Primary Examiner* — Vip Patel
(74) *Attorney, Agent, or Firm* — ArentFox Schiff LLP

(57) ABSTRACT

In one embodiment, the light-emitting diode module comprises a carrier and a plurality of light-emitting diodes. Thereby, several types of light-emitting diodes are present. The light-emitting diodes can be controlled individually or in groups electrically independently of one another. The light-emitting diodes each comprise a first and a second electrical contact. The carrier comprises several electrically conductive main layers, between each of which there is an electrically insulating intermediate layer. The contacts of the light-emitting diodes are attached to a carrier upper side on one of the first main layers. Starting from the first contacts, electrical through-connections are each connected directly to a carrier underside with a last main layer of the main layers. Starting from the second contacts, electrical through-connection each terminate at a penultimate main layer of the main layers, wherein the penultimate main layer is located inside the carrier.

17 Claims, 11 Drawing Sheets

(56) References Cited

U.S. PATENT DOCUMENTS

2018/0190184 A1 7/2018 Kim et al.
2018/0190880 A1 7/2018 Vampola et al.

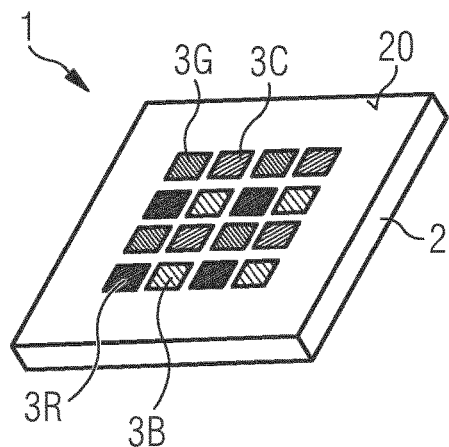
FIG 18
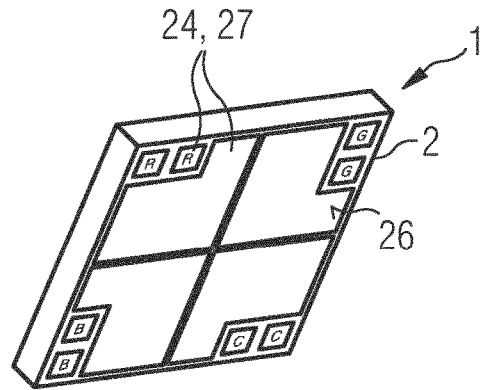
FIG 19
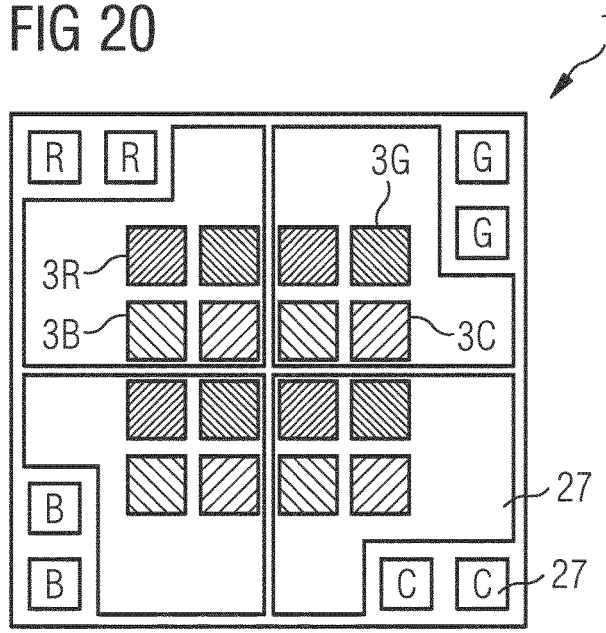
FIG 20
FIG 21
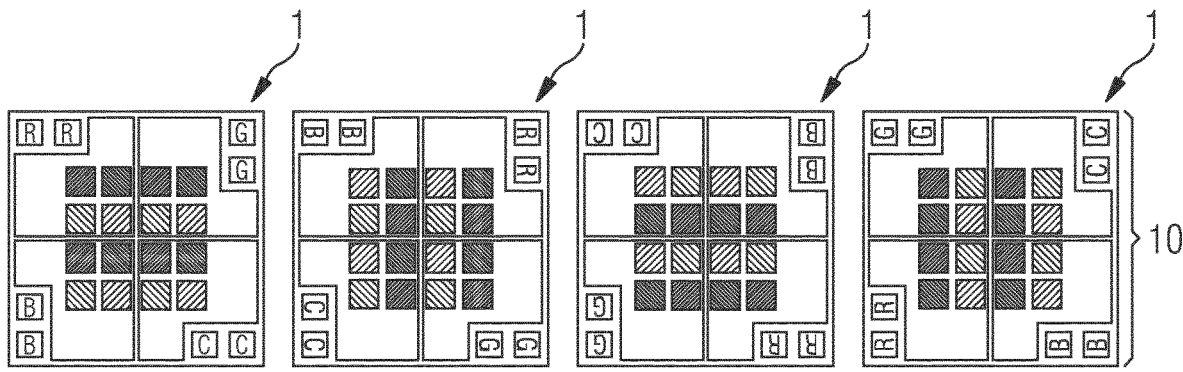

LIGHT-EMITTING DIODE MODULE AND ASSEMBLY WITH A LIGHT-EMITTING DIODE MODULE

This application is a 35 U.S.C. § 371 National Phase of PCT Application No. PCT/EP2020/052854, filed Feb. 5, 2020, which claims priority to German Patent Application No. 102019102953.8, filed Feb. 6, 2019, the disclosures of each of which are hereby incorporated by reference herein in their entireties.

A light-emitting diode module is specified. Furthermore, an assembly with such a light-emitting diode module is specified.

A task to be solved is to specify a light-emitting diode module in which individually controllable light-emitting diodes can be efficiently cooled and electrically contacted.

This task is solved inter alia by a light-emitting diode module with the features of claim 1. Preferred further developments are the subject of the remaining claims.

According to at least one embodiment, the light-emitting diode module comprises a carrier. The carrier is, for example, a multilayer printed circuit board. The carrier comprises a carrier upper side. Opposite the carrier upper side is a carrier underside.

According to at least one embodiment, the light-emitting diode module comprises a plurality of light-emitting diodes. Depending on the application, one or, preferably, two or more than two different types of light-emitting diodes are present. The light-emitting diode types differ with respect to their spectral radiation characteristics.

The light-emitting diode types differ by different light-emitting diode chips and/or by different phosphors, by which a wavelength conversion of radiation of a light-emitting diode chip can take place within the respective light-emitting diode. The individual light-emitting diodes of the light-emitting diode types can each contain exactly one or also several light-emitting diode chips According to at least one embodiment, the light-emitting diodes are electrically independently controllable individually or in groups. If the light-emitting diodes are electrically combined into groups, the groups preferably comprise only a comparatively small number of light-emitting diodes each, preferably at most 20 light-emitting diodes or eight light-emitting diodes or four light-emitting diodes or two light-emitting diodes. Preferably, each light-emitting diode is electrically controllable independently of the other light-emitting diodes. The light-emitting diodes are electrically connected and wired accordingly by means of the carrier.

According to at least one embodiment, the light-emitting diodes each comprise a first electrical contact and a second electrical contact. The respective associated light-emitting diode is electrically contacted at the electrical contacts and is preferably also mechanically attached. In particular, the first and second electrical contacts of a respective light-emitting diode are the only electrical and optionally mechanical contacts of this light-emitting diode.

According to at least one embodiment, the carrier comprises a plurality of electrically conductive main layers. The main layers are formed by copper layers, for example. Preferably, the main layers are structured so that conductor paths and/or electrical contact regions within the respective main layer can be formed by an electrically conductive material, in particular by copper. The main layers are each preferably electrically separated from one another by an electrically insulating intermediate layer. The main layers are numbered consecutively starting at the carrier upper side and continuing to the carrier underside.

According to at least one embodiment, the first and second electrical contacts of the light-emitting diodes are attached to the carrier upper side on a first main layer of the main layers of the carrier. For example, the light-emitting diodes with the first and second contacts are soldered or electrically conductively glued to the first main layer. That is, apart from a bonding agent such as a solder or an adhesive, the first and second electrical contacts of the light-emitting diodes are preferably located directly on the first main layer.

According to at least one embodiment, the first contacts of the light-emitting diodes are each connected to a last main layer of the main layers via electrical through-connections. These through-connections thus extend from the first main layer to the last main layer. The last main layer is preferably located directly on the carrier underside.

According to at least one embodiment, the through-connections for the first contacts extend from the first contacts as seen in plan view. That is, the first contacts and the through-connections preferably overlap each other partially or completely when viewed from above. Alternatively, this means that a distance between the first contacts and the associated through-connections as seen in a plan view of the carrier upper side is at most 10% or 20% or 50% of a mean edge length of the light-emitting diode associated with the respective first contact. In other words, the through-connections for the first contacts are located directly below the first contacts or at least close to the first contacts, as seen in a plan view. By means of these through-connections for the first contacts, efficient heat dissipation of the light-emitting diodes is provided.

According to at least one embodiment, electrical through-connections extending from the second contacts of the light-emitting diodes each terminate at a penultimate main layer of the main layers. This penultimate main layer is located inside the carrier. The penultimate main layer is the main layer closest to the last main layer. The second contacts may analogously to the first contacts partially or completely cover the associated electrical through-connections or are located at a small distance from these through-connections, as seen in a plan view of the carrier upper side. The explanations relating to the first contacts apply accordingly to the through-connections of the second contacts. The fact that the through-connections of the second contacts end close to the carrier underside improves heat dissipation from the light-emitting diodes through the carrier.

In at least one embodiment, the light-emitting diode module comprises a carrier and a plurality of light-emitting diodes. At least two different types of light-emitting diodes are provided. The light-emitting diodes are electrically independently controllable individually or in groups. The light-emitting diodes each comprise a first and a second electrical contact. The carrier comprises several electrically conductive main layers, between each of which an electrically insulating intermediate layer is arranged. The contacts of the light-emitting diodes are attached to a carrier upper side on one of the first main layers. Starting from the first contacts, electrical through-connection are each connected directly to a carrier underside via a last main layer of the main layers. Starting from the second contacts, electrical through-connections each terminate at a penultimate main layer of the main layers, wherein the penultimate main layer is located inside the carrier.

In the light-emitting diode module described herein, light-emitting diodes are preferably used which comprise a size similar to that of an associated light-emitting diode chip when viewed from above. Such light-emitting diodes are also referred to as CSP, for Chip Sized Package. The light-emitting diodes are preferably arranged regularly, in particular in a matrix-shaped grid of rows and columns. Depending on the application, the light-emitting diodes preferably comprise one or more common anodes or common cathodes. A row-by-row and/or a column-by-column matrix interconnection is also conceivable. The light-emitting diodes should and can be electrically controlled individually, in particular via corresponding driver ICs.

For example, by means of a common or by means of a few common switchable sources, especially as anode, and by means of many individual open-collector outputs of a controller IC, each light-emitting diode can be controlled individually. A preferred carrier is a printed circuit board, also referred to as PCB. For cost reasons, the carrier ideally has as few conductor path layers as possible, such as copper layers.

Each light-emitting diode preferably has two electrical contacts that are adapted to be thermally conductive. These first and second contacts are opposite each other when viewed from an underside of the respective light-emitting diode. An imaginary logical longitudinal axis of the associated light-emitting diode can extend through the two contacts, even if the light-emitting diode were wider than it is long. The light-emitting diodes can be arranged in the rows or in the columns in such a way that all longitudinal axes of the light-emitting diodes of the respective row or column lie on a common straight line.

By placing the through-connections in the carrier directly below the contacts of the light-emitting diodes, or only slightly offset from the contacts, waste heat from the light-emitting diodes can be efficiently conducted through the carrier to the last and penultimate main layers. Thus, waste heat can also be conducted close to the lowermost main layer via the second contacts, so that efficient heat dissipation can be achieved by large heat-conducting surfaces at the through-connection.

The inner main layers of the carrier preferably have an array of anode through-connections and cathode through-connections below a region with the light-emitting diodes. All of the cathode through-connection or anode through-connection are preferably connected to conductor paths that extend outward from the interior of the region with the light-emitting diodes, as seen in a plan view of the carrier upper side. Preferably, all anode through-connection or cathode through-connection are extend downward without conductor paths and are connected to large-area common anode contact region. Preferably, all electrical contact regions for external electrical contacting and mounting of the light-emitting diode module are located at the lowest main layer.

Preferably, exactly one, exactly two or exactly four different types of light-emitting diodes are present, which emit in different colors or color temperatures. Preferably, the light-emitting diodes are arranged in such a way that by rotating the module, a different color and/or type of light-emitting diode moves to a specific position in each case. That is, with a 180° rotation for two colors and a 90° rotation for four colors, for example, a specific corner of the light-emitting diode module can be configured for each emission color. That is, different configurations with different emission characteristics can be obtained by appropriate rotations of the light-emitting diode module. Thus, in particular, several identical light-emitting diode modules can be present, arranged differently in a common assembly.

Preferably, control of the light-emitting diodes via electrical contact regions on the carrier is completely rotationally symmetrical, so that neither an electrical conductor path on a mounting platform nor an architecture of a controlling unit needs to be significantly changed when light-emitting diode modules are mounted in different rotations. The contact regions of the light-emitting diode module are preferably symmetrical both geometrically and electrically.

On the carrier underside of the light-emitting diode module, at least one common contact for the anodes or cathodes is located, preferably in a module center below the region with the light-emitting diodes, in order to achieve efficient heat dissipation. All light-emitting diodes are preferably similarly efficiently deheated. In this way, a contacting process is not unnecessarily complicated and the thermal behavior of the light-emitting diodes in operation is similar.

Cathode contacts may be arranged externally around the center of the module, as seen in a plan view. In each case, adjacent cathode contacts can be assigned to light-emitting diodes with anode contacts that are different from one another. Thus, different controlling units can be used, in particular controlling units with one current output as well as with two current outputs.

Preferably, the positions of the light-emitting diodes on the carrier are chosen rotationally symmetrically, whereas the types of light-emitting diodes are preferably placed anti-rotationally symmetrically. This means that upon rotation by an angle of symmetry, light-emitting diodes with a different radiation characteristic are preferably placed in exact alignment. For example, an original checkerboard pattern would accordingly be rotationally symmetrical, whereas a checkerboard pattern, cut open in the middle and the lower half mirrored about the vertical axis, is to be regarded as 180° anti-rotationally symmetrical.

In the light-emitting diode module described here, a through-connection for each light-emitting diode thus runs from one of the contacts directly to the last copper layer of the carrier. A second contacting for the second contacts of the light-emitting diodes extends to the penultimate copper layer. In the region of the through-connection belonging to the light-emitting diode contacts, electrical conductor paths preferably run parallel to one another, wherein logical parallelism is meant here and geometric parallelism need not necessarily be exactly fulfilled.

Conductor paths are preferably distributed over an even number of main layers, for example two copper layers for 16 light-emitting diodes. Each two conductor path main layers are preferably mirror-symmetrical and/or rotationally symmetrical to each other. This means in particular a logical symmetry, not necessarily an exact geometric symmetry. Preferably, there is a rotational symmetry of 180°. Electrical contact regions on the lowest main layer preferably retain their spatial and logical assignment to the positions of the light-emitting diode contacts when rotated by 180° in the case of two types of light-emitting diode, or when rotated by 90° in the case of four types of light-emitting diode.

With this light-emitting diode module, efficient utilization of the central main layers for electrical and thermal connection of the light-emitting diodes is provided. This allows more space for possible additional functions on the first main layer. A minimum number of main layers is required for routing of the conductor paths and for electrical contacting of the light-emitting diodes, so that cost-efficient carriers can be used. In addition, maximum possible heat conduction in a vertical direction from the first to the last main layer can be achieved. Furthermore, a best possible heat dissipation of the second light-emitting diode contacts from the first to the penultimate main layer can be achieved.

Effort is saved in guiding and designing conductor paths due to additional control options and increased clarity, so that the probability of errors when creating or constructing the conductor paths can be reduced. Due to a rotationally symmetrical usability of the light-emitting diode module, it is possible to efficiently superimpose different colors by appropriate imaging optics in case of an assembly consisting of several light-emitting diode modules.

According to at least one embodiment, the carrier comprises between four and eight, inclusive, of the main layers. In particular, there are exactly four or exactly six of the main layers, particularly preferably exactly four main layers.

According to at least one embodiment, two or more than two adjacent main layers each comprise electrical conductor paths. These main layers are preferably inner main layers. In particular, the through-connections assigned to the second contacts can be controlled electrically independently of one another via these conductor paths.

According to at least one embodiment, the second main layer and the penultimate, thus in particular third, main layer each comprise electrical conductor paths. The second and third main layers are internal main layers. It is possible that only the second and third main layers contain electrical conductor paths. That is, the main layers on the carrier upper side and on the carrier underside can be free of conductor paths. Accordingly, all inner main layers may be provided with conductor paths.

According to at least one embodiment, the through-connections associated with the second contacts can be electrically controlled independently of one another via the conductor paths of the second and third main layers. That is, electrical interconnection within the carrier is preferably performed exclusively via the inner main layers, specifically exclusively via the second and third main layers.

According to at least one embodiment, the conductor paths of the second and penultimate main layers are designed to be point-symmetrical or mirror-symmetrical with respect to one another. This can be seen when the corresponding main layers are placed next to each other and viewed in plan view. The mirror symmetry or point symmetry can be geometrically maintained or merely aims at a logical, electrical structure of the conductor paths.

According to at least one embodiment, the light-emitting diodes are arranged along one or more rows. The first and second contacts of the light-emitting diodes in a given row are preferably arranged along a straight line. Per row of light-emitting diodes, there is preferably exactly one row of electrical contacts provided.

According to at least one embodiment, the conductor paths do not intersect the at least one row of light-emitting diodes. Thus, conductor paths may extend between adjacent rows, but not between or below light-emitting diodes within a given row. As a result, the electrical contacts, light-emitting diodes, and associated through-connections may be placed in close proximity to one another within a row.

According to at least one embodiment, the carrier comprises two or more than two electrical contact regions on the carrier underside and/or on the carrier upper side for external electrical connection of the first contacts of the light-emitting diodes. Alternatively, only one electrical contact region for electrical connection of all first contacts is provided at the carrier underside.

According to at least one embodiment, multiple electrical contact regions are provided on the carrier underside. Each of these contact regions is configured for the first contacts, so that per contact region a plurality of the through-connections extending from the first contacts terminate at the corresponding electrical contact region. The through-connections for the first contacts may extend completely through the carrier and/or uninterruptedly from the first main layer to the last main layer.

According to at least one embodiment, the carrier comprises a plurality of electrical contact regions on the carrier underside and/or on the carrier upper side for individual or group-wise external electrical connection of the second contacts of the light-emitting diodes. In particular, there is a one-to-one assignment between these contact regions and the second contacts.

According to at least one embodiment, the electrical contact regions for the second contacts are located next to the light-emitting diodes as seen in a plan view of the carrier underside. These contact regions for external electrical contacting of the second contacts are each electrically connected via at least one electrical through-connection to at least one inner main layer of the carrier.

A current path to the second contacts thus preferably takes place via the corresponding through-connections directly on the second contacts, via an inner main layer and via an electrical through-connection on the external electrical contact regions to the electrical contact regions. Thereby, all through-connections may extend perpendicularly or approximately perpendicularly to the carrier upper side and/or the carrier underside.

According to at least one embodiment, the light-emitting diodes are arranged antipoint-symmetrically as seen in a plan view of the carrier upper side. Thus, each light-emitting diode of a first of the light-emitting diode types can be mapped by means of point symmetry onto one of the light-emitting diodes of a second of the light-emitting diode types. For all light-emitting diodes, there is preferably exactly one common symmetry point for the point symmetry. Preferably, exactly two different types of light-emitting diodes are present.

According to at least one embodiment, the contact regions for the second contacts of light-emitting diodes, wherein these light-emitting diodes are arranged antipoint-symmetrically to one another, are oriented and arranged point-symmetrically to one another. That is, there is a point-symmetry between the respective light-emitting diodes as well as between the contact regions for the second contacts associated with these light-emitting diodes. In this embodiment, both point symmetries comprise the same, common symmetry point.

However, depending on the application, it can also be advantageous if the two symmetry points are not congruent when viewed from above. For example, the matrix with the light-emitting diode chips could be located at one end of an elongated module and the contact regions could be positioned at the other end. This may be preferred, especially for modules with large light-emitting diode chip arrays, to allow the light-emitting diode chip regions of multiple modules to be placed close together. The previously described advantages due to the point symmetries are nevertheless retained.

The contact regions as well as the associated light-emitting diodes may be located at different distances from the symmetry point and comprise different angles of rotation around the symmetry point, relative to a reference line through the symmetry point.

According to at least one embodiment, the light-emitting diodes, as seen in a plan view of the carrier upper side, are arranged antimirror-symmetrically such that each light-emitting diode of a first of the light-emitting diode types can be mapped by means of mirror symmetry onto one of the light-emitting diodes of a second of the light-emitting diode types. This can also apply to third and fourth types of light-emitting diodes. In particular, however, there are exactly two light-emitting diode types. It is possible that exactly one mirror line is present. The mirror line is preferably aligned perpendicular to the rows along which the light-emitting diodes are arranged.

According to at least one embodiment, the contact regions, in particular the contact regions for the second contacts, and the associated light-emitting diodes have the same symmetry point when seen in a plan view of the carrier upper side. This applies in particular to a point symmetry.

According to at least one embodiment, an overall arrangement of the light-emitting diodes can be subdivided into four quadrants of equal size, as seen in a plan view of the carrier upper side. The quadrants comprise equal numbers of light-emitting diodes.

According to at least one embodiment, all quadrants of the overall arrangement can be mapped onto one another by means of translation or by means of translation in combination with rotation. That is, the quadrants can have the same design with respect to the arrangement of the light-emitting diodes as well as the distribution of the types of light-emitting diodes or the same design except for rotation.

According to at least one embodiment, one of the exactly two types of light-emitting diodes is formed from a plurality of light-emitting diodes for generating warm white light. The other of the light-emitting diode types is formed from a plurality of light-emitting diodes for generating cool white light. The two types of light-emitting diodes preferably comprise the same number of light-emitting diodes. Warm white light refers in particular to a correlated color temperature of the emitted light of 2000 K to 5000 K, cold white light refers in particular to white light with a correlated color temperature of more than 5000 K to 8500 K.

According to at least one embodiment, the light-emitting diode module comprises exactly four different types of light-emitting diodes. Preferably, several light-emitting diodes are present per light-emitting diode type. In particular, a light-emitting diode type for generating red light, a light-emitting diode type for generating green light and a light-emitting diode type for generating blue light are present. Furthermore, a light-emitting diode type for generating cyan-colored light, also referred to as lagun-colored light, and/or for generating yellow light may be present.

Blue light particularly refers to light with a dominant wavelength between 420 nm and 480 nm, inclusive. Cyan-colored light refers in particular to light with a dominant wavelength of more than 480 nm and of at most 515 nm, and green refers in the present case to light with a dominant wavelength of more than 515 nm and of at most 550 nm. Yellow light refers to light with a dominant wavelength above 550 nm up to and including 585 nm, red light refers to dominant wavelengths above 585 nm up to and including 650 nm.

According to at least one embodiment, the light-emitting diodes are each surface mountable devices. That is, all electrical contacts of the light-emitting diodes are located on a single side of the light-emitting diodes, preferably facing the carrier.

According to at least one embodiment, the light-emitting diode module comprises at least eight or twelve of the light-emitting diodes. Alternatively or additionally, at most 300 or 144 or 64 or 36 of the light-emitting diodes are present per light-emitting diode module. Preferably, the number of light-emitting diodes is 16.

According to at least one embodiment, a mean edge length of the light-emitting diodes, as seen in a plan view of the carrier upper side, is each greater than a mean edge length of a light-emitting diode chip of the respective light-emitting diode by at most a factor of 3 or 2 or 1.5 or 1.1. That is, a light-emitting area of a light-emitting diode chip can be approximately the same size as an area of the associated light-emitting diode. Thus, a high luminance can be achieved in the module center in which the light-emitting diodes are arranged on the carrier, and the light-emitting diodes can be arranged close to each other with respect to their light-emitting areas.

Furthermore, an assembly with one or more light-emitting diode modules is specified. Features for the assembly are also disclosed for the light-emitting diode modules, and vice versa.

In at least one embodiment, the assembly comprises one or more control units, for example formed by microcontroller ICs. The light-emitting diodes are independently controllable individually or in groups by means of the associated control unit. There can be a one-to-one assignment between the light-emitting diode modules and the control units.

According to at least one embodiment, the at least one control unit is arranged at a distance from the associated carrier. Alternatively, it is possible for the control unit to be mounted on the carrier or to the carrier or to be integrated into the carrier. That is, the carrier may optionally comprise an embedded microchip for the control unit.

According to at least one embodiment, the assembly comprises a plurality of the light-emitting diode modules. The light-emitting diode modules may be combined into one or more components. For example, a plurality of components with 2×2 light-emitting diode modules are provided.

According to at least one embodiment, the assembly comprises one or more optics. There is preferably a one-to-one association between the components and the optics. The optics are, for example, lenses such as converging lenses or Fresnel lenses.

According to at least one embodiment, the assembly is installed as interior lighting in a motor vehicle. For example, the assembly is a reading light in a car. The reading light may be associated with individual seating positions, such that there may be one assembly described herein per seating position.

In the following, a light-emitting diode module described herein and an assembly described herein are explained in more detail with reference to the drawing by means of exemplary embodiments. Identical reference signs specify identical elements in the individual figures. However, no references to scale are shown, rather individual elements may be shown exaggeratedly large for better understanding.

In the figures:

FIGS. 18 and 19 show schematic perspective views of an exemplary embodiment of a light-emitting diode module described herein.

FIG. 20 shows a schematic plan view of an exemplary embodiment of a light-emitting diode module described herein.

FIG. 21 shows a schematic top view of an exemplary embodiment of an assembly with several light-emitting diode modules described herein.

Figure 24:
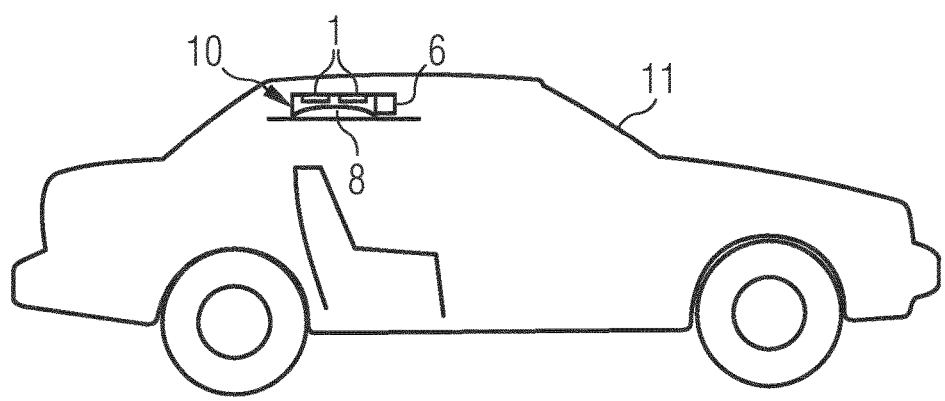
Figure 25:
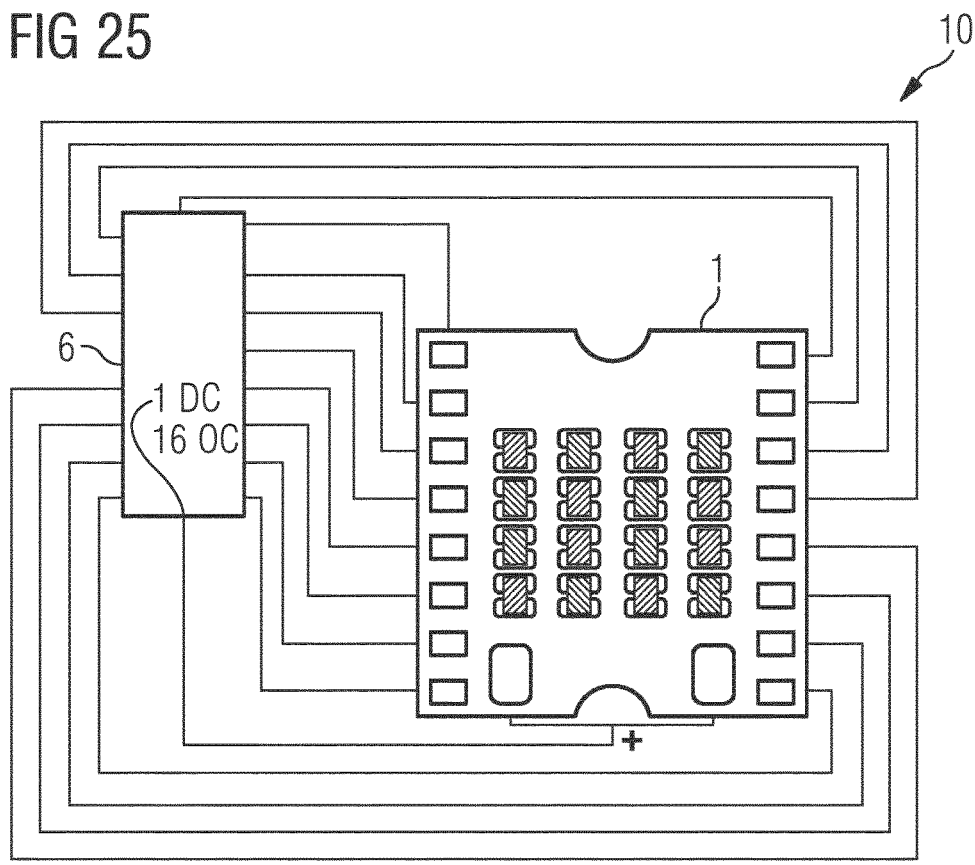
Figure 26:
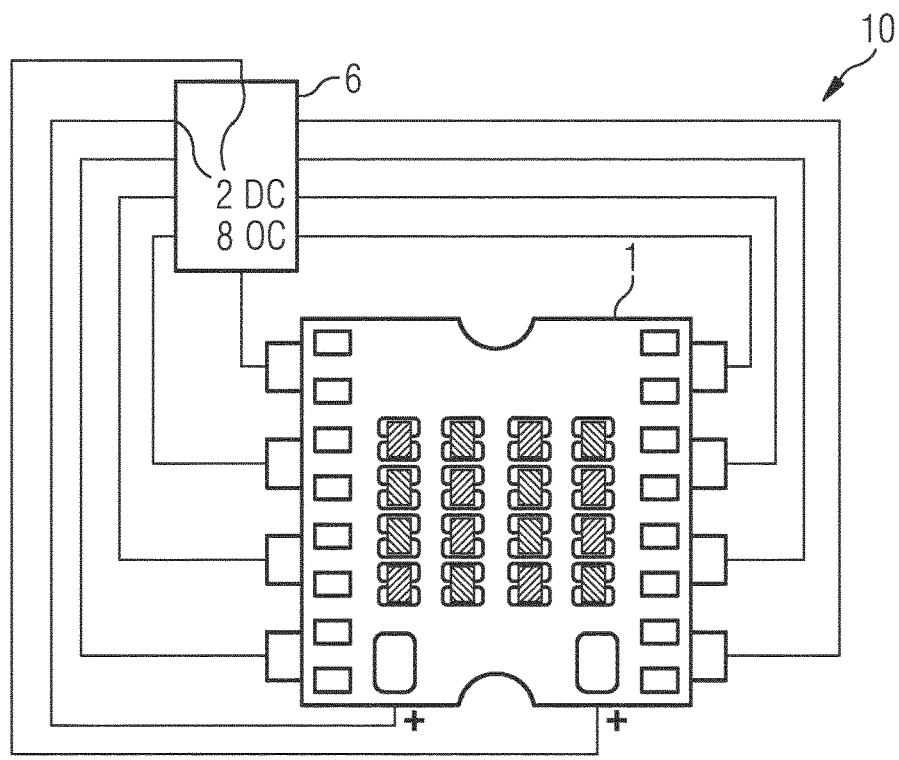
Figure 27:
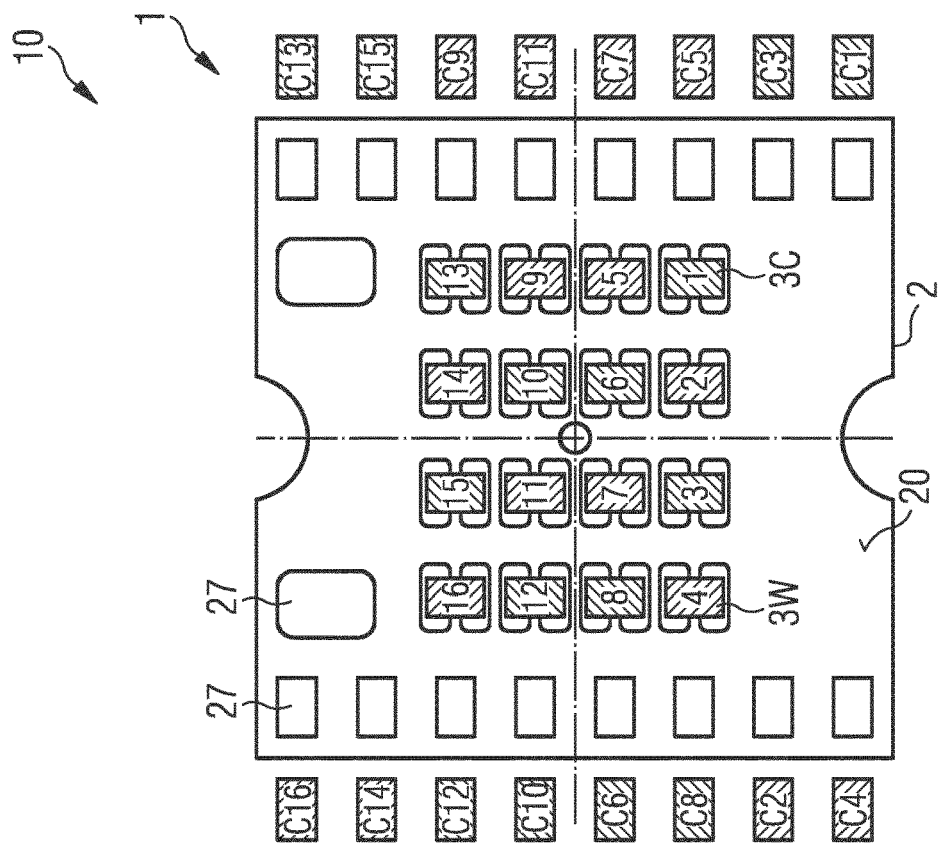
Figure 27:
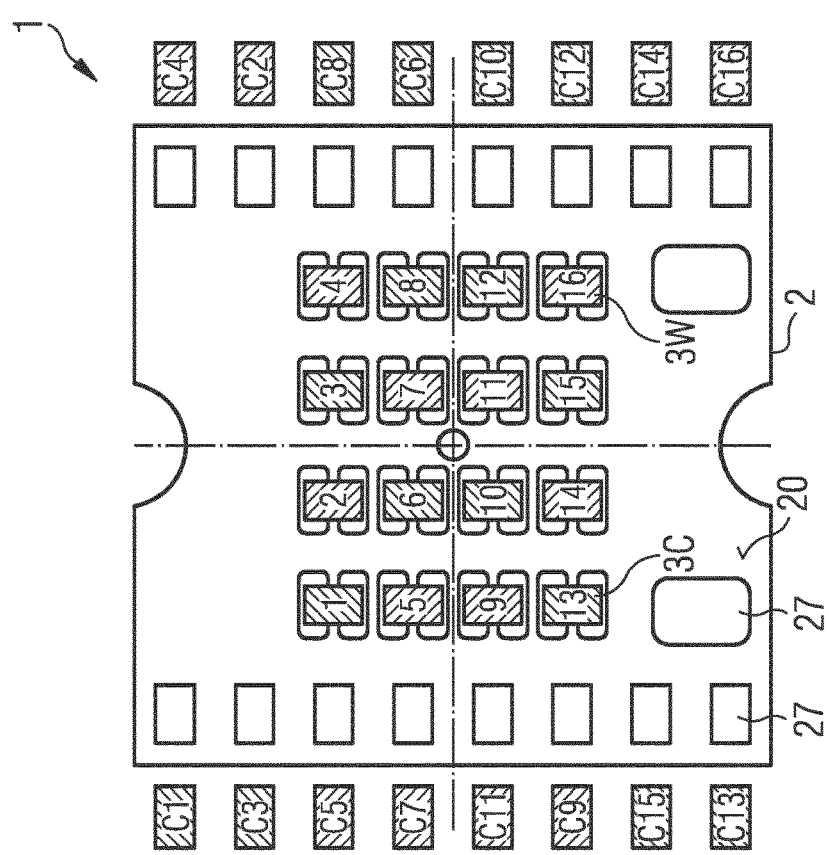

FIG. 24 schematic sectional view of a motor vehicle with an exemplary embodiment of an assembly described herein, and FIGS. 25 to 27 schematic top views of exemplary embodiments of assemblies described herein.

Figure 1:
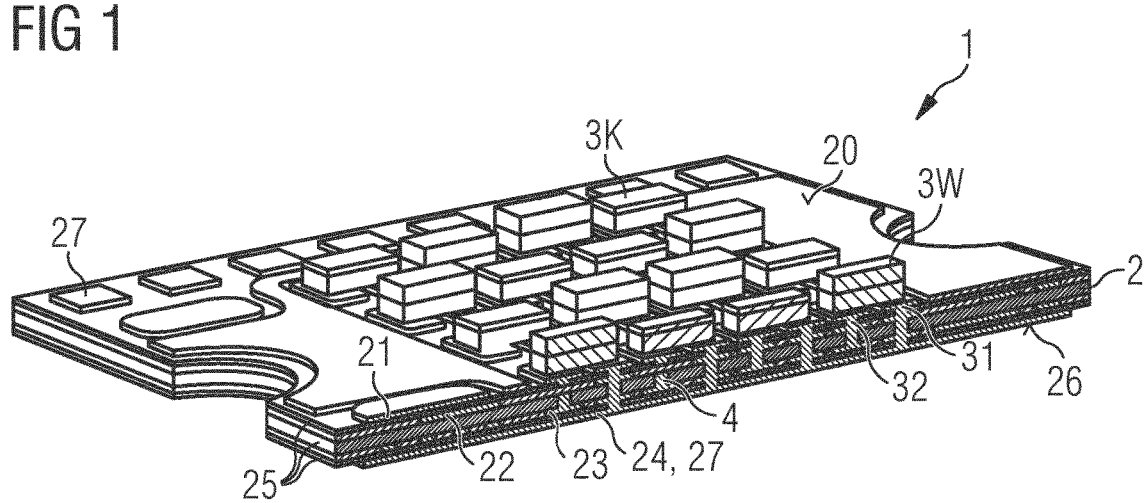
FIGS. 1 and 2 show schematic perspective sectional views of an exemplary embodiment of a light-emitting diode module described herein.
Figure 2:
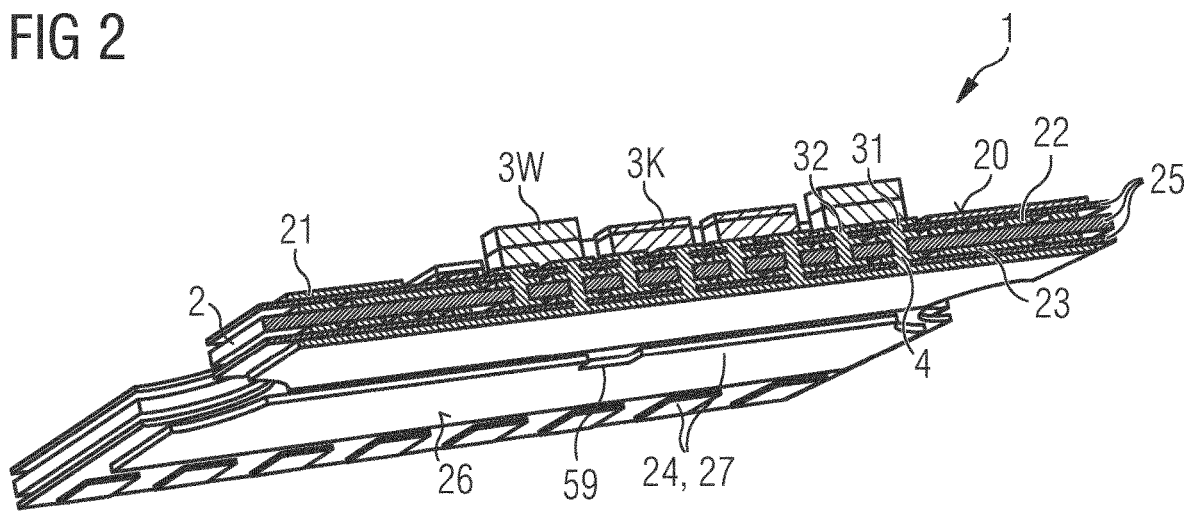

FIGS. 1 and 2 show schematic perspective sectional views of an exemplary embodiment of a light-emitting diode module 1. The light-emitting diode module 1 comprises a carrier 2. The carrier 2 includes four main layers 21, 22, 23, 24 made of a structured, electrically conductive material, in particular copper. A first main layer 21 of the main layers is located directly on a carrier upper side 20 and a fourth main layer 24 of the main layers is located directly on a carrier underside 26. The main layers 21, 24 on the main sides 20, 26 are structured to form electrical contact regions 27.

A second main layer 22 and a third main layer 23 are located inside the carrier 2. These main layers 22, 23 are structured to form conductor paths. A numbering of the main layers 21, 22, 23, 24 takes place from the carrier upper side 20 to the carrier underside 26. Between adjacent main layers 21, 22, 23, 24 there is in each case an electrically insulating intermediate layer 25, for example made of a fiber-reinforced epoxy.

On the carrier upper side 20 there are light-emitting diodes 3W emitting warm white light and light-emitting diodes 3K emitting cool white light. For example, the light-emitting diodes 3W, 3K are arranged in a regular 4×4 matrix. Electrical contacts 31, 32 of the light-emitting diodes 3K, 3W face the carrier upper side 20. The light-emitting diodes 3K, 3W are preferably electrically individually controllable.

Two large contact regions 27, in particular for anodes of the light-emitting diodes 3K, 3W, are located on the carrier underside 26. One half of each of the light-emitting diodes 3K, 3W is assigned to one of the two large contact regions 27. In order to ensure a correct orientation of the light-emitting diode module 1 during an assembly, at least one of the large contact regions 27 may comprise a structuring as a position marking 59, as is also possible in all other exemplary embodiments.

The first contacts 31 are each located above a through-connection 4, which extends continuously from the first main layer 21 to the last main layer 24. This provides an efficient thermal connection of the first contacts 31 to the last main layer 24. The second contacts 32 are located above electrical through-connections 4, which extend to the penultimate main layer 23 and thus close to the last main layer 24. Thus, a thermal resistance from the second contacts 32 to the carrier underside 26 is also comparatively small.

The main layers 21, 22, 23, 24 are based on copper, for example. A thickness of the main layers 21, 22, 23, 24 is for example between 15 μm and 50 μm inclusive. A diameter of the through-connections is, for example, between 50 μm and 120 μm, inclusive. A metallization collar around the through-connections 4 comprises, for example, a width of at least 30 μm and/or of at most 120 μm. The two outer intermediate layers 25 are preferably relatively thin, in particular with a thickness between 10 μm and 40 μm inclusive, for example approximately 30 μm. The middle intermediate layer 25 preferably comprises a greater thickness, for example between 60 μm and 0.2 mm inclusive. For better solderability, the contact regions 27 may be provided with a metallic coating, for example of NiAu with a thickness around 7 μm. An overall thickness of the carrier 2 is preferably between 0.2 mm and 1 mm inclusive, in particular around 0.5 mm. The through-connections 4 may be partially or completely filled with a metal such as copper and are preferably configured for a current of at least 30 mA and/or of at most 0.5 A. The above values may apply individually or in combination to all other exemplary embodiments.

Figure 3:
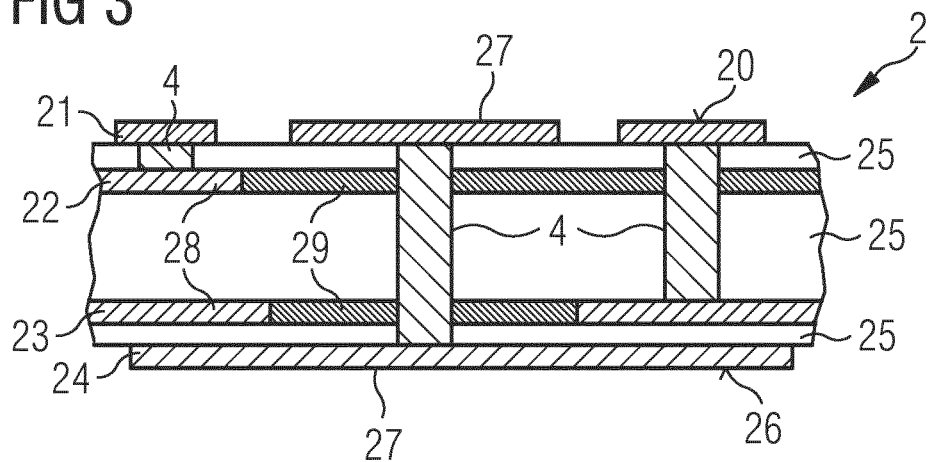
FIG. 3 shows a schematic sectional view of a carrier for light-emitting diode modules described herein.

In FIG. 3, the structure of the carrier 2 is shown schematically. The outer main layers 21, 24 can be structured to form the contact regions 27. The inner main layers 22, 23 preferably each comprise a structured metallization 28 so that conductor paths can be formed. These metallizations 28 can be planarized by means of an electrical insulation layer 29, so that the middle main layers 22, 23 also comprise a constant thickness throughout and the intermediate layers 25 can be laminated, for example. The through-connections 4 can make electrical connections of different depths between different main layers 21, 22, 23, 24.

Figure 4:
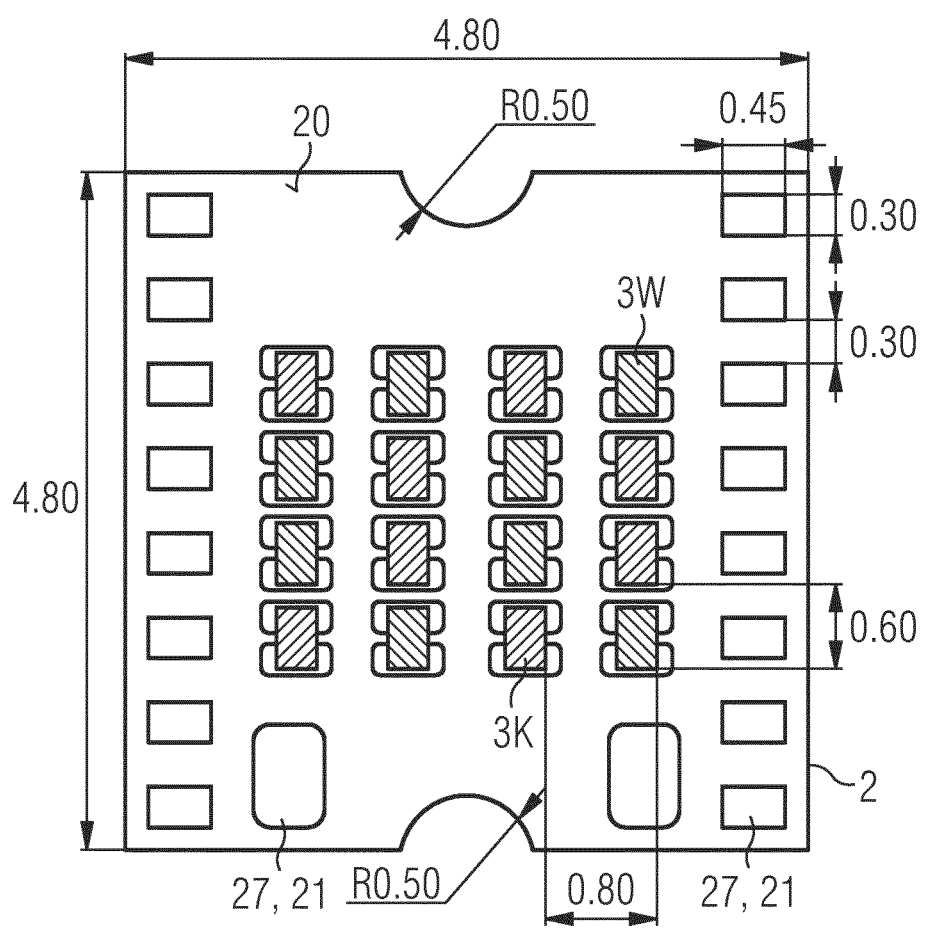
FIGS. 4 and 5 show a schematic plan view and a schematic bottom view of an exemplary embodiment of a light-emitting diode module described herein.
Figure 5:
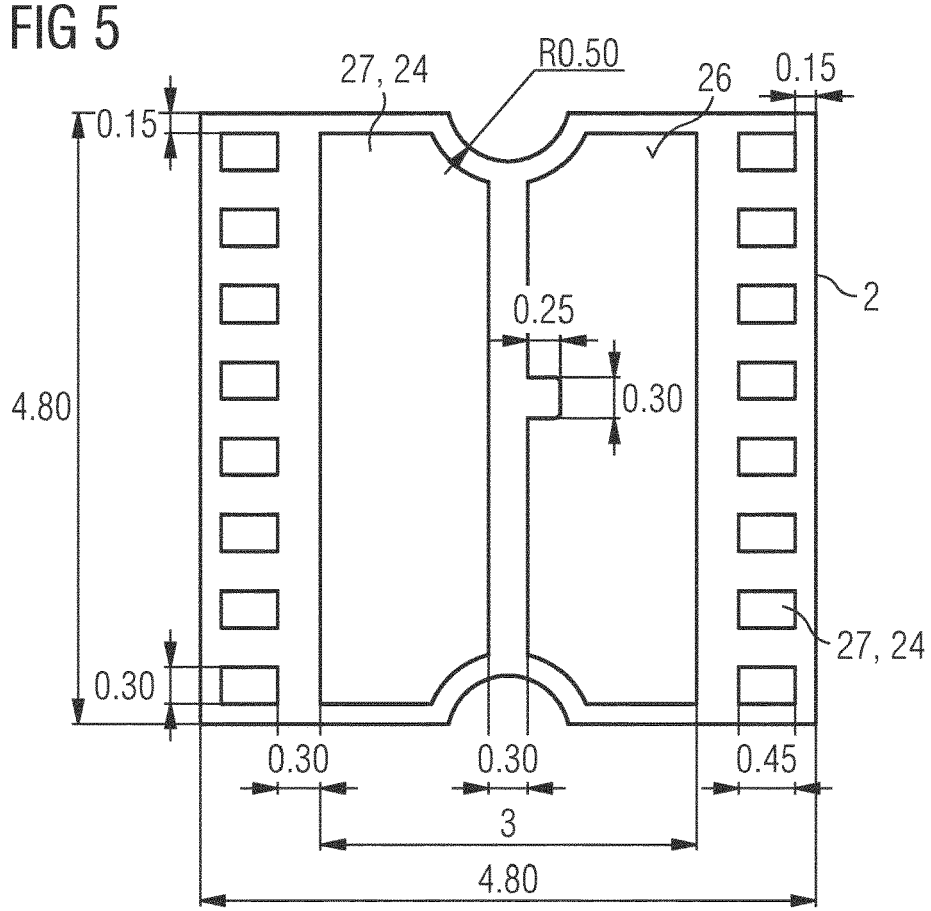

In FIGS. 4 and 5, the exemplary embodiment of FIGS. 1 and 2 is shown in a schematic top view and in a schematic bottom view. In each case, exemplary dimensions for the carrier 2 and for a placement of the light-emitting diodes 3K, 3W are shown. The illustrated dimensions may apply individually or in combination. Preferably, relative ratios of the dimensions to each other are given with a tolerance of at most a factor of 2 or 1.5 or 1.2.

Figure 6:
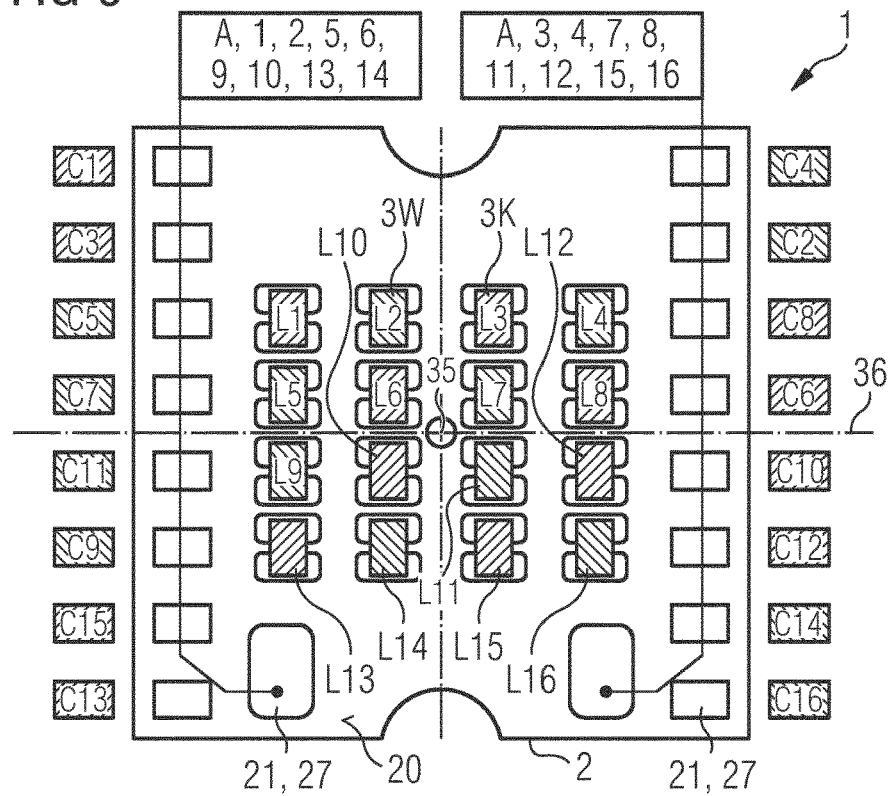
FIG. 6 shows a schematic representation of an association between light-emitting diodes and electrical contact regions of an exemplary embodiment of a light-emitting diode module described herein.

FIG. 6 illustrates an electrical assignment between contact regions 27 and light-emitting diodes 3W, 3K. The contact regions 27 for cathode contacts are numbered with C1 to C16, the light-emitting diodes are numbered with L1 to L16. The light-emitting diode L1 is thus assigned the cathode contact C1 as well as the anode contact A1 and so on. Eight of the light-emitting diodes are assigned to each of the two contact regions 27 for the anodes, and the anode contacts are abbreviated A.

The two types of light-emitting diodes 3W, 3K are arranged antipoint-symmetrically with respect to a center point and symmetry point 35 of the carrier 2. For example, the cold white emitting light-emitting diode L1 is arranged antipoint-symmetrically to the warm white emitting light-emitting diode L16, the cold white emitting light-emitting diode L10 is arranged antipoint-symmetrically to the warm white emitting light-emitting diode L7, and so on. The anode contact regions associated with the light-emitting diodes are likewise arranged in a point-symmetrical manner. In addition, the light-emitting diodes are arranged in an anti-mirror symmetrical manner with respect to a mirror axis 36 running horizontally through the symmetry point 35 in FIG. 6.

For example, the contact region C1 assigned to the light-emitting diode L1 is arranged point-symmetrically with respect to the contact region C16 of the light-emitting diode L16. Accordingly, contact region C10 assigned to light-emitting diode L10 is arranged point-symmetrically with respect to contact region C7 assigned to light-emitting diode L7, and so on. That is, light-emitting diodes of the light-emitting diode types arranged in an antipoint-symmetrical manner have corresponding cathode contacts arranged in a point-symmetrical manner.

The light-emitting diodes 3W, 3K are arranged in four quadrants, wherein the quadrants are of equal size. The two lower quadrants in FIG. 6 and the two upper quadrants merge into each other via translation. The contact regions for the cathodes C1 to C16 are not arranged in the same quadrant as the assembly of the light-emitting diodes 3W, 3K. At least within the respective quadrants, adjacent cathode contact regions C1 to C16 are alternately assigned to the two contact regions 27 for the anode contacts.

Figure 7:
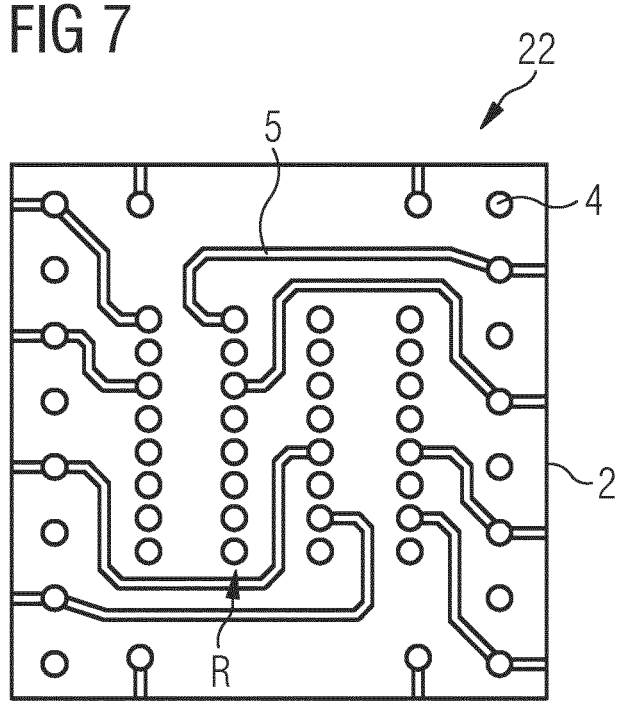
FIGS. 7 and 8 show schematic plan views of conductor path structures of inner main layers for exemplary embodiments of light-emitting diode modules described herein.
Figure 8:
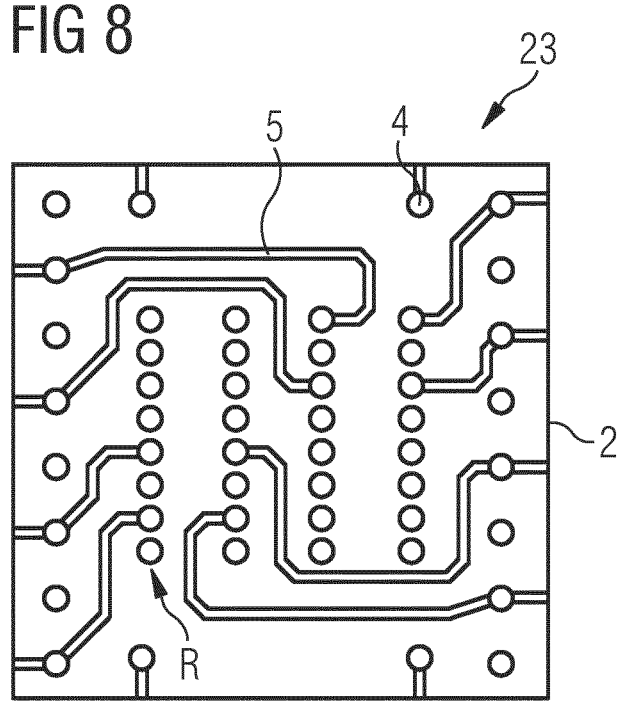

FIGS. 7 and 8 schematically show the structuring of the internal main layers 22, 23. All contacts of light-emitting diodes arranged in a row R are also on a straight line like the associated light-emitting diodes. By means of conductor paths 5, the corresponding contact regions are connected via the through-connections 4 with the corresponding electrical contact regions.

The conductor paths 5 do not intersect the rows R. The conductor paths 5 are as short as possible. Furthermore, the conductor structure of FIG. 7 is mirror-symmetrical to the structure of FIG. 8 when viewed in plan and side-by-side. Thus, within the rows R, the through-connections 4 can be located close to each other.

Figure 9:
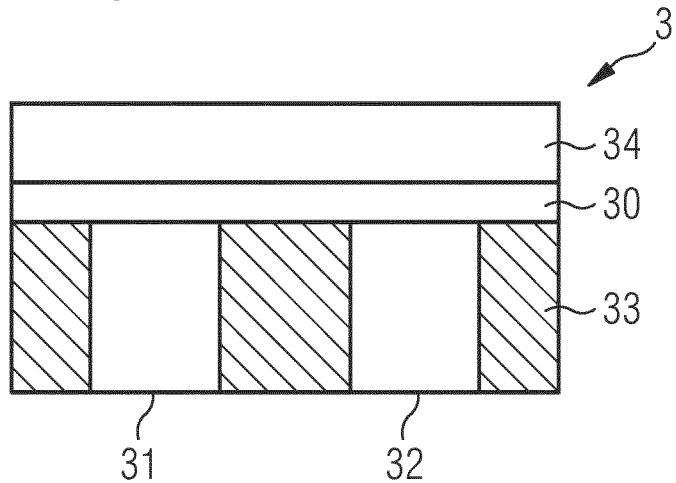
FIG. 9 shows a schematic sectional view of an exemplary embodiment of a light-emitting diode for light-emitting diode modules described herein.

FIG. 9 schematically illustrates in sectional view an exemplary embodiment of a light-emitting diode 3. The light-emitting diode 3 comprises a light-emitting diode chip 30 which is based, for example, on the material system AlInGaN. The light-emitting diode chip 30 is attached to contacts 31, 32. The contacts 31, 32 may be formed by comparatively thick metallizations.

It is possible that the contacts 31, 32 are embedded in a potting body 33. On a side of the light-emitting diode chip 30 facing away from the contacts 31, 32, there may be a phosphor layer 34. When viewed from above, a total area of the light-emitting diode 3 is approximately equal to a total area of the light-emitting diode chip 30.

Figure 10:
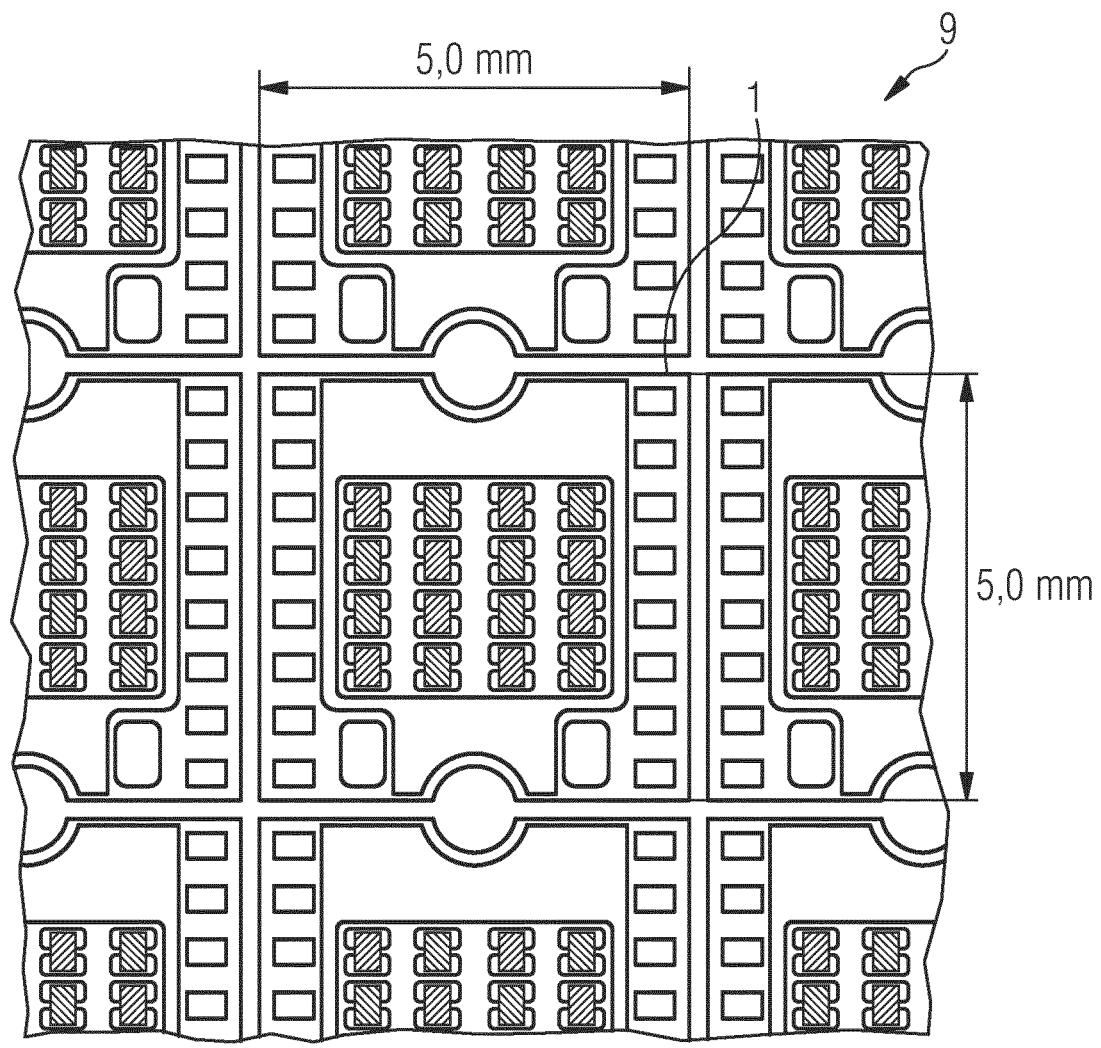
FIG. 10 shows a schematic plan view of a panel with light-emitting diode modules described herein.

In FIG. 10, a panel 9 comprising a plurality of the light-emitting diode modules 1 is illustrated. The individual light-emitting diode modules 1 comprise comparatively small lateral dimensions. For example, the lateral dimensions are each in the range of 5 mm. The panel 9 can be separated into the light-emitting modules 1 by means of sawing, for example.

Figure 11:
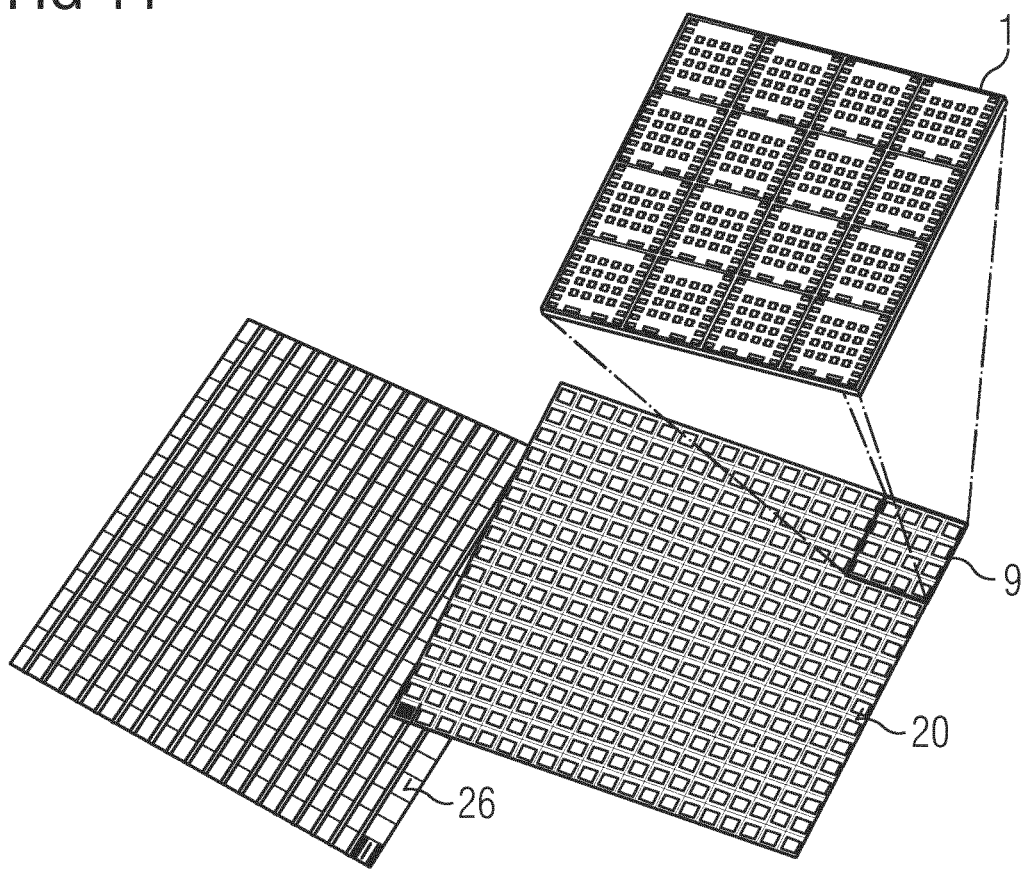
FIG. 11 shows a schematic perspective view of light-emitting diode modules and panels.

FIG. 11 illustrates that light-emitting diode modules 1 with several regions of light-emitting diodes 3 arranged close to each other can also be produced from the panel 9.

FIGS. 12 to 17 illustrate another exemplary embodiment of a light-emitting diode module 1. The light-emitting diode module 1 comprises four different types of light-emitting diodes. Thus, green emitting light-emitting diodes 3G, red emitting light-emitting diodes 3R, blue emitting light-emitting diodes 3B and cyan emitting light-emitting diodes 3C are provided.

Figure 12:
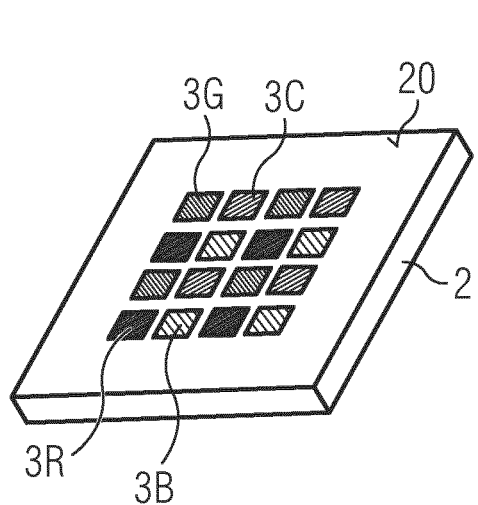
FIGS. 12 and 13 show schematic perspective views of an exemplary embodiment of a light-emitting diode module described herein.
Figure 14:
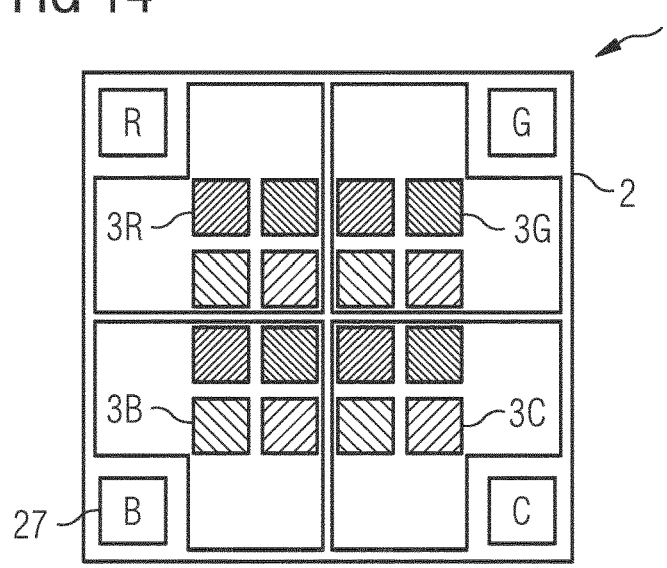
FIGS. 14 and 15 show schematic plan views of an exemplary embodiment of a light-emitting diode module described herein and an associated assembly.

The light-emitting diodes are arranged in four quadrants which can be mapped onto each other by means of translation, see in particular FIGS. 12 and 14. At each corner of the quadrants and also at each corner of the overall assembly of light-emitting diodes there is a light-emitting diode of a different color.

Figure 13:
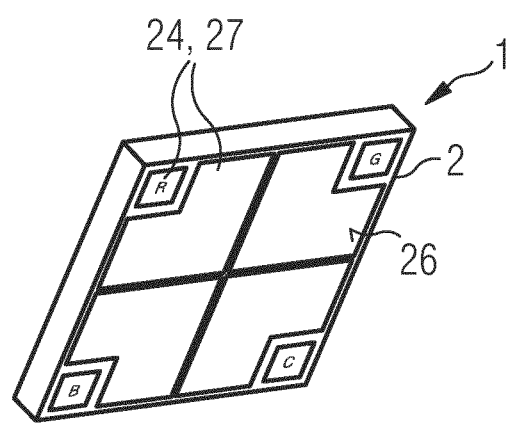

As can be seen in particular from FIG. 13, there are four large contact regions 27 as anode contacts on the underside 26, as well as four small contact regions 27 for controlling one emission color each. This means that the individual colors can be electrically controlled independently of one another. In particular, exactly one contact region 27 is provided as anode contact for each quadrant.

Figure 15:
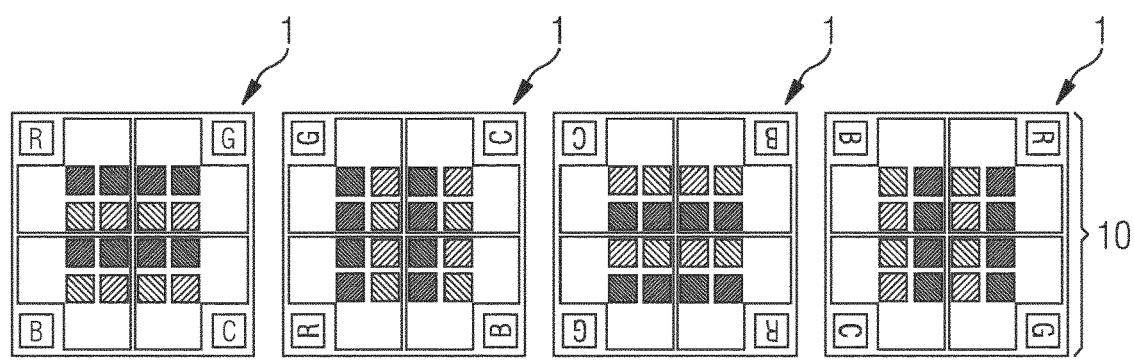

FIG. 15 shows that an assembly 10 comprises four of the light-emitting diode modules 1. The light-emitting diode modules 1 are each arranged rotated by 90° relative to one another. This allows efficient color mixing to be achieved across the Assembly 10. Instead of a linear assembly of the light-emitting diode modules 1, the light-emitting diode modules 1 can also be arranged in a regular 2×2 matrix.

Figure 16:
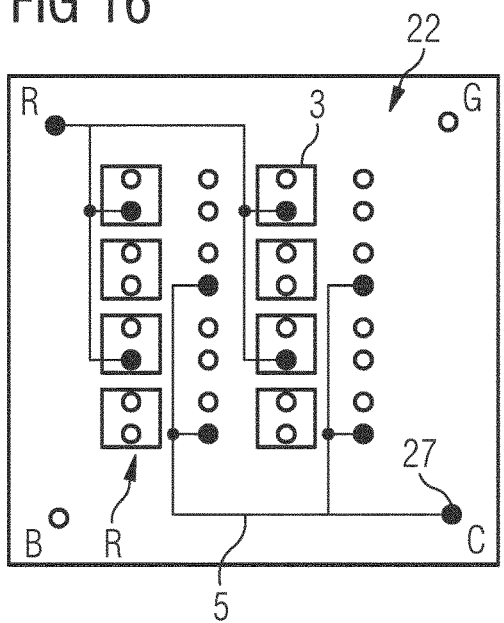
FIGS. 16 and 17 show schematic wiring diagrams of inner main layers for exemplary embodiments of light-emitting diode modules described herein.
Figure 17:
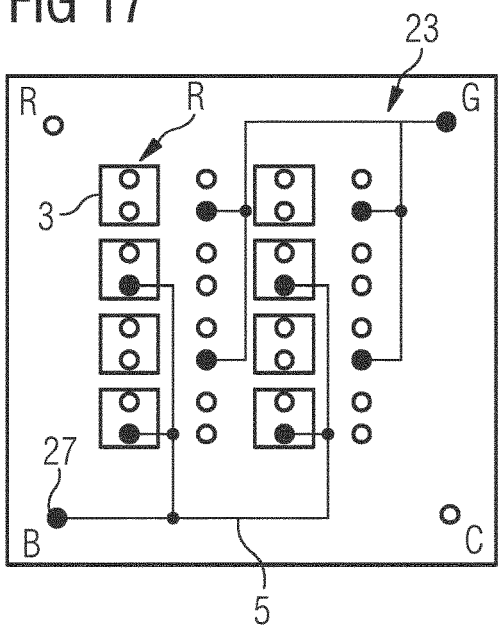

FIGS. 16 and 17 show schematic interconnections of the light-emitting diodes in the two inner main layers 22, 23. Again, the conductor paths 5 do not cross the individual rows R. All light-emitting diode chips of a certain emission color are electrically preferably interconnected in a single main layer 22, 23.

Also in the exemplary embodiment of FIGS. 18 to 23, four light-emitting diode types are present, analogously to FIGS. 13 to 17. Two light-emitting diodes of each of the four light-emitting diodes of one light-emitting diode type are electrically combined. Thus, a total of eight independently controllable groups of light-emitting diodes are present. The assembly of the light-emitting diodes on the carrier upper side 20 is analogous to FIGS. 12 to 14.

Two cathode contacts for a particular emission color are preferably present at corner regions of the four quadrants. Again, one common anode contact region is preferably present per quadrant.

Figure 22:
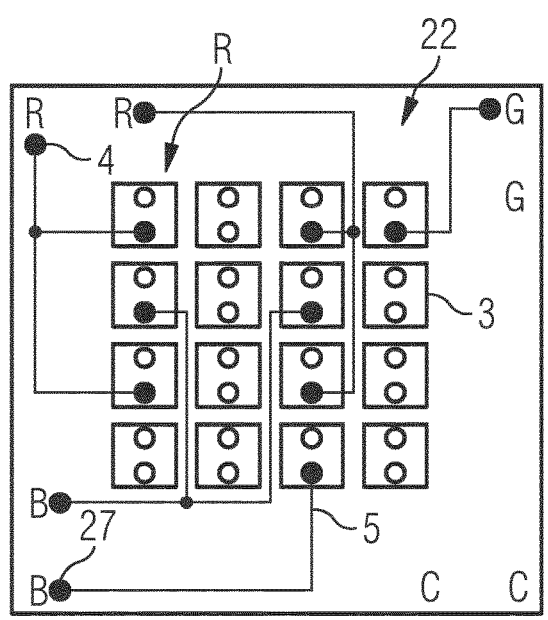
FIGS. 22 and 23 show schematic wiring diagrams of inner main layers for exemplary embodiments of light-emitting diode modules described herein.
Figure 23:
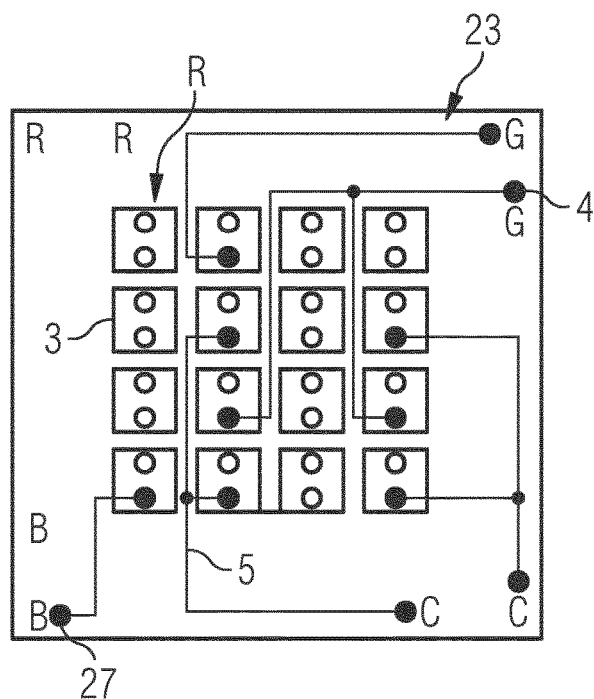

The interconnection of the light-emitting diodes in the two inner main layers 22, 23 is explained in FIGS. 22 and 23. A grouping of light-emitting diodes can take place across the main layers 22, 23. For example, the upper right contact region for one of the green emitting groups is connected to the associated light-emitting diodes via both the second main layer 22 and the third main layer 23. The through-connections 4 are designed accordingly so that the required main layers 21, 22, 23, 24 are electrically interconnected with each other in certain regions.

FIG. 24 illustrates that the assembly 10 comprises a plurality of the light-emitting diode modules 1, for example in a 2×2 matrix. The assembly 10 further comprises an optic 8, which is preferably commonly arranged downstream of the light-emitting diode modules 1. Such an optic 8 may also be present in any other exemplary embodiment of the assembly 10. Furthermore, one or more control units 6 are provided for controlling the light-emitting diode modules 1.

The assembly 10 is installed in a motor vehicle 11, for example a car. The assembly 10 is, for example, a reading light which is assigned to individual seating positions in the motor vehicle 11. One of the assemblies 10 may be present per seating position. To simplify the illustration, only a single assembly 10 is drawn.

FIGS. 25 and 26 schematically illustrate further exemplary embodiments of assemblies 10. The assemblies 10 each comprise a control unit 6 associated with a light-emitting diode module 1. The light-emitting diode module 1 is constructed, for example, as illustrated in connection with FIGS. 1, 2 and 4 to 8. A common mounting carrier as a mounting platform for the light-emitting diode module 1 and for the control unit 6 is not drawn.

Referring to FIG. 25, the control unit 6 comprises a direct current output DC and 16 open-collector outputs OC. The direct current output DC is assigned to the two larger anode contact regions. The 16 outputs OC are each assigned to one of the smaller contact regions for the cathode contacts of the light-emitting diodes.

FIG. 26 shows that the control unit 6 comprises two switchable direct current outputs DC and only eight open-collector outputs OC. The two larger contact regions for the anode contacts are each connected to one of the direct current outputs DC. The smaller cathode contact regions are arranged in such a way that along an edge line preferably adjacent cathode contact regions can be assigned to only one of the outputs OC.

The two cathode contact regions assigned to a common output OC are each assigned to one of the two larger contact regions for the anode contacts, so that in turn individual controllability of the light-emitting diodes results. This is achievable in particular with the circuit design as shown in FIGS. 6 to 8.

By using a plurality of anode contact regions, control units 6 of simpler construction can thus be used, so that the assembly 10 can be manufactured more economically.

As in all exemplary embodiments, it is also possible for the light-emitting diode module 1 and the control unit 6 to be mounted on a mounting carrier that is not drawn, for example another printed circuit board.

In FIG. 27, the assembly 10 comprises only two of the light-emitting diode modules 1, constructed for example as shown in FIGS. 1 and 2. The two light-emitting diode modules 1 are arranged next to each other rotated by 180° with respect to each other.

Unless otherwise indicated, the elements shown in the figures preferably follow each other directly in the order indicated. Layers not touching in the figures are preferably spaced apart. Insofar as lines are drawn parallel to each other, the corresponding surfaces are preferably also aligned parallel to each other. Likewise, unless otherwise indicated, the relative positions of the drawn elements to each other are correctly reproduced in the figures.

The invention described herein is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

This patent application claims priority to German patent application 10 2019 102 953.8, the disclosure content of which is hereby incorporated by reference.

REFERENCES 1 light-emitting diode module
2 carrier
20 carrier upper side
21 . . . 24 electrically conducting main layer
25 electrically insulating intermediate layer
26 carrier underside
27 electrical contact region
28 metallization
29 electrically insulation layer
3 light-emitting diode
30 light-emitting diode chip
31 first electrical contact
32 second electrical contact
33 potting body
34 phosphor layer
35 symmetry point/center
36 mirror axis
4 electrical through-connection
5 conductor path
59 position marking
6 control unit
7 component
8 optic
9 panel
10 assembly
11 motor vehicle
A . . . anode contact . . .
C . . . cathode contact . . .
L . . . light-emitting diode . . .
DC, OC direct current output, open-collector output
R row

The invention claimed is:

1. A light-emitting diode module with a carrier and with several light-emitting diodes, wherein
   at least two different types of light-emitting diodes are present,
   the light-emitting diodes are electrically independently controllable individually or in groups,
   each light-emitting diode comprises a first and a second electrical contact,
   the carrier comprises a plurality of electrically conductive main layers, between each of which an electrically insulating intermediate layer is arranged,
   the contacts of the light-emitting diodes are attached to a carrier upper side on a first main layer of the main layers,
   starting from all first contacts, electrical through-connections each extend directly to a last main layer of the main layers directly at a carrier underside and are directly connected to the last main layer,
   starting from all second contacts, electrical through-connections each extend directly to a penultimate main layer of the main layers, located inside the carrier, and terminate at the penultimate main layer, and
   a second main layer of the main layers and the penultimate main layer each comprise electrical conductor paths, and the through-connections assigned to the second contacts can each be driven electrically independently of one another by means of the conductor paths of the second and the penultimate main layer.

2. The light-emitting diode module according to the preceding claim 1,
   wherein the through-connections extending from the contacts are each partially or completely covered by the associated contact when viewed in a plan view,
   wherein between inclusively four and eight of the main layers are present.

3. The light-emitting diode module according to claim 2, wherein the carrier comprises exactly four of the main layers.

4. The light-emitting diode module according to claim 1, wherein the conductor paths of the second and the penultimate main layer, when seen side-by-side and in a plan view, are of mirror-symmetrical design.

5. The light-emitting diode module according to claim 1, wherein the light-emitting diodes are arranged along at least one row such that the contacts of the light-emitting diodes of the at least one row are arranged along a straight line,
wherein the conductor paths and the at least one row do not intersect.

6. The light-emitting diode module according to claim 1, wherein the carrier comprises, at least on the carrier underside, two or more than two electrical contact regions for external electrical contacting of the first contacts of the light-emitting diodes,
wherein at each contact region for the first contacts a plurality of the through-connections extending from the first contacts terminate.

7. The light-emitting diode module according to claim 1, wherein the carrier comprises, at least on the carrier underside, a plurality of electrical contact regions for individual external electrical contacting of the second contacts of the light-emitting diodes,
wherein the electrical contact regions for the second contacts are located next to the light-emitting diodes, as seen in a plan view, and are each electrically connected via at least one electrical through-connection with an inner main layer of the carrier.

8. The light-emitting diode module according to claim 1, wherein the light-emitting diodes, as seen in a plan view, are arranged antipoint-symmetrically in such a way that each light-emitting diode of a first of the light-emitting diode types can be mapped by means of point symmetry onto one of the light-emitting diodes of a second of the light-emitting diode types,
wherein exactly one common symmetry point for the point symmetry is present for all light-emitting diodes.

9. The light-emitting diode module according to claim 7, wherein the contact regions for the second contacts of light-emitting diodes, which are arranged antipoint-symmetrically with respect to one another, are also arranged point-symmetrically with respect to one another.

10. The light-emitting diode module according to claim 7, in which the contact regions for the second contacts and the associated light-emitting diodes exhibit the same symmetry point, as seen in a plan view of the carrier upper side.

11. The light-emitting diode module according to claim 1, wherein the light-emitting diodes, as seen in a plan view, are arranged antimirror-symmetrically in such a way that each light-emitting diode of a first of the light-emitting diode types can be mapped by means of mirror symmetry onto one of the light-emitting diodes of a second of the light-emitting diode types, wherein exactly one mirror axis is present.

12. The light-emitting diode module according to claim 1, wherein an overall arrangement of the light-emitting diodes, as seen in a plan view, can be subdivided into four quadrants of equal size, so that all quadrants can be mapped onto one another by means of translation or by means of translation in combination with rotation.

13. The light-emitting diode module according to claim 1, wherein one of exactly two types of light-emitting diodes is formed by a plurality of light-emitting diodes for generating warm white light and the other of the types of light-emitting diodes is formed by a plurality of light-emitting diodes for generating cool white light.

14. The light-emitting diode module according to claim 1, wherein one of exactly four light-emitting diode types is formed of a plurality of light-emitting diodes for generating red light, one of the light-emitting diode types is formed of a plurality of light-emitting diodes for generating green light, one of the light-emitting diode types is formed of a plurality of light-emitting diodes for generating cyan light, and the remaining light-emitting diode type is formed of a plurality of light-emitting diodes for generating blue light.

15. The light-emitting diode module according to claim 1, wherein the light-emitting diodes are each surface mountable,
wherein the light-emitting diode module comprises between 8 and 144, inclusive, of the light-emitting diodes,
wherein, seen in a plan view, a mean edge length of the light-emitting diodes is greater than a mean edge length of a light-emitting diode chip of the respective light-emitting diode by at most a factor of 3.

16. An assembly with at least one light-emitting diode module according to claim 1 and with at least one control unit,
wherein the light-emitting diodes are individually controllable by means of the control unit, and
wherein the control unit is arranged at a distance from the carrier.

17. The assembly according to claim 16, comprising a plurality of the light-emitting diode modules,
wherein the light-emitting diode modules are aggregated into a plurality of components,
wherein the assembly further comprises a plurality of optics and each of the components is associated with one of the optics, and
wherein the assembly is installed as interior lighting in a motor vehicle.

* * * * *